United States Patent
Ido et al.

(10) Patent No.: US 7,583,737 B2
(45) Date of Patent: Sep. 1, 2009

(54) OFDM SIGNAL RECEIVER DEVICE AND OFDM SIGNAL RECEIVING METHOD

(75) Inventors: Jun Ido, Tokyo (JP); Eiji Arita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 638 days.

(21) Appl. No.: 10/555,443

(22) PCT Filed: Dec. 19, 2003

(86) PCT No.: PCT/JP03/16299
§ 371 (c)(1),
(2), (4) Date: Nov. 3, 2005

(87) PCT Pub. No.: WO2004/107622
PCT Pub. Date: Dec. 9, 2004

(65) Prior Publication Data
US 2006/0056280 A1      Mar. 16, 2006

(30) Foreign Application Priority Data
May 30, 2003      (JP)      ............................. 2003-153913

(51) Int. Cl.
H04K 1/10      (2006.01)
(52) U.S. Cl. .................. 375/260; 375/136; 375/145; 375/149; 375/350; 375/355; 375/362
(58) Field of Classification Search ............... 375/260, 375/136, 145, 149, 350, 355, 362
See application file for complete search history.

(56) References Cited

U.S. PATENT DOCUMENTS

| 6,628,738 B1 * | 9/2003 | Peeters et al. ............... 375/371 |
| 6,862,552 B2 * | 3/2005 | Goldstein et al. ........... 702/179 |
| 2006/0291578 A1 * | 12/2006 | Singh et al. ................. 375/260 |

FOREIGN PATENT DOCUMENTS

| JP | 2002-026860 A | 1/2002 |
| JP | 2002-094484 A | 3/2002 |
| JP | 2002-344414 A | 11/2002 |
| JP | 2003-134082 A | 5/2003 |

* cited by examiner

Primary Examiner—Shuwang Liu
Assistant Examiner—Kabir A Timory
(74) Attorney, Agent, or Firm—Birch, Stewart, Kolasch & Birch, LLP

(57) ABSTRACT

The present invention relates to a OFDM signal receiver device that performs weighting for branch metrics based on average noise power or signal-to-noise power ratio and conducts Viterbi decoding based on the result of the weighting. In the present invention, based on a demodulated signal, electric power corresponding to a noise component contained in the demodulated signal is calculated. A noise power signal corresponding to the result of the calculation is output from a noise power-calculating unit 8. Based on the noise power signal and a transmission channel characteristic corresponding to a subcarrier component that is output from an interpolation filter unit, a weighing factor for a branch metric is calculated by a weighting factor-calculating unit 9, and based on the weighting factor, the demodulated signal is decoded by decoding unit 10.

12 Claims, 12 Drawing Sheets

F I G. 1
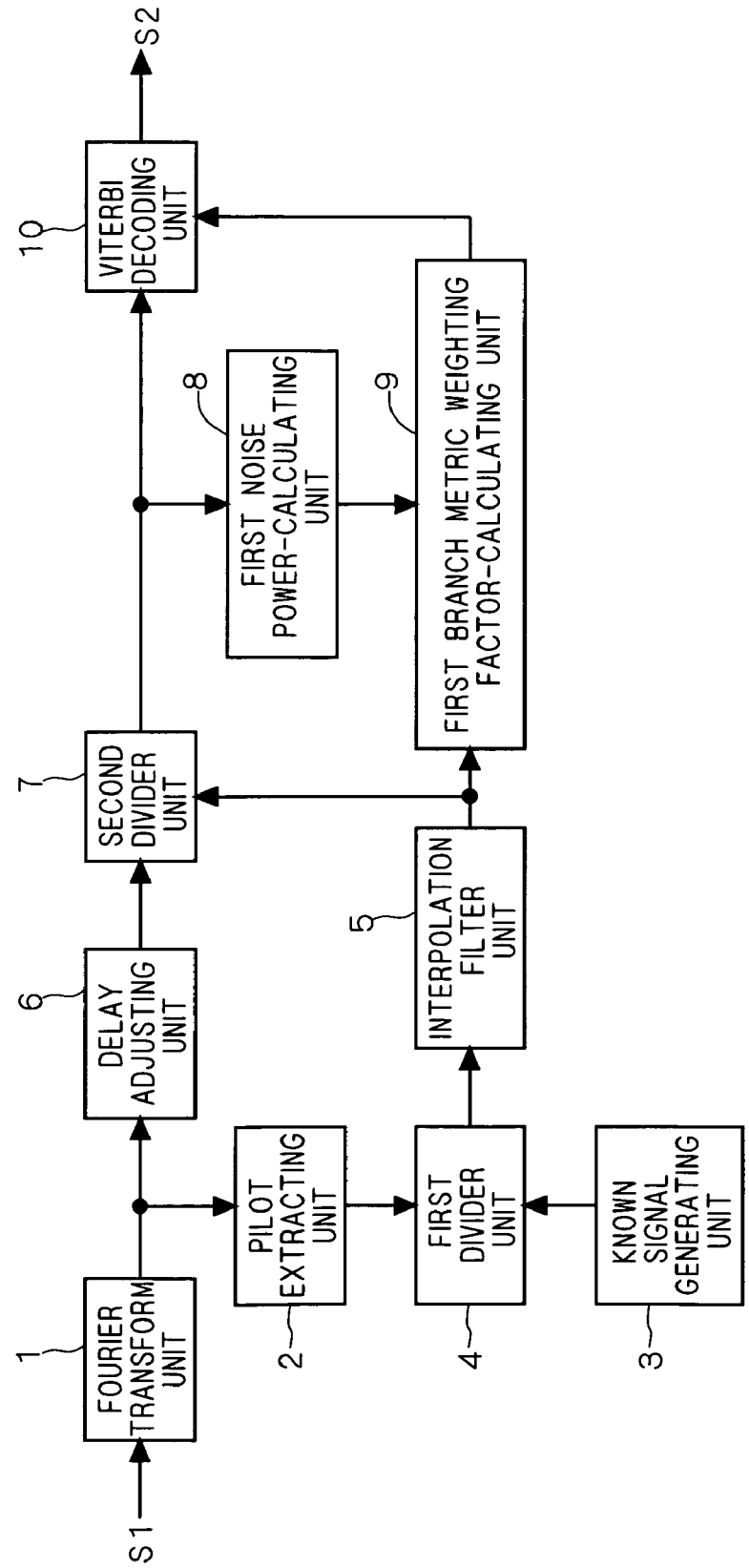

OFDM SIGNAL RECEIVER DEVICE AND OFDM SIGNAL RECEIVING METHOD

TECHNICAL FIELD

The present invention relates to a receiver device and a method of receiving orthogonal frequency division multiplexing (hereinafter referred to as "OFDM") signal.

BACKGROUND ART

A conventional OFDM signal receiver device (hereinafter also simply referred to as a "receiver device") performs a Fourier transform on an OFDM signal. Then, in synchronization with a subcarrier component obtained as a result of the Fourier transform, the receiver device generates a pre-transmission pilot signal (hereinafter also referred to as a "transmission pilot signal"), which is a known signal. By dividing a subcarrier component of a pilot signal in the subcarrier component contained in a received OFDM signal (hereinafter the pilot signal is also referred to as a "received pilot signal") by the transmission pilot signal, the receiver device calculates transmission channel characteristic corresponding to the received pilot signal. Then, by filtering the transmission channel characteristic of the received pilot signal with an interpolation filter for interpolating the transmission channel characteristic along a time axis and a frequency axis, it calculates transmission channel characteristics corresponding to all the subcarrier components. Further, by dividing the subcarrier components by the transmission channel characteristics corresponding to the output of the interpolation filter, the phase and amplitude of the subcarrier components are corrected to demodulate the subcarrier components.

Next, when convolutionally coded data are transmitted in the form of orthogonal frequency division multiplexing, the data need to be decoded by a Viterbi decoder after they are demodulated into subcarrier components. Herein, Viterbi decoding refers to a decoding method in which maximum likelihood decoding is efficiently executed utilizing the repetitive structure of convolutional code. First, the Viterbi decoder obtains a branch metric indicating the likelihood between a receiving point constellation of a subcarrier component after the phase and amplitude of which have been corrected and a signal point constellation uniquely determined depending on the modulation format. Then, it obtains all the surviving paths in possible trellises, obtains the accumulated totals of the branch metrics of the respective paths, and selects the path with the least accumulated total. The Viterbi decoder outputs the selected path state as the decoding result to reproduce the transmission data.

Japanese Patent Application Laid-Open No. 2002-344414 (hereinafter also referred to as "Patent Document 1") shows one example of an OFDM signal receiver device having a Viterbi decoder. The OFDM signal receiver device in Patent Document 1 comprises an equalizer for waveform equalizing an amplitude modulation signal obtained by a Fourier transform and a transmission channel decoding circuit having a Viterbi decoder therein. The receiver device gives a less weight to a branch metric corresponding to a signal modulated into a subcarrier located at a band edge of the OFDM signal symbol than the weight given to a branch metric corresponding to a signal modulated into a subcarrier at the band center of the symbol. Thereby, the signal modulated into the subcarrier positioned at the band edge of the symbol has a lower degree of contribution to the state metric than the signal modulated into the subcarrier positioned at the band center.

Such a conventional OFDM signal receiver device as described above computes a Euclidean distance, which is the likelihood between a signal constellation of a demodulated subcarrier component and a signal constellation uniquely determined depending on the modulation format, and based the result, it calculates a branch metric. Therefore, the branch metric obtained by the conventional receiver device does not take into consideration the electric power corresponding to the average of the noise components contained in demodulated signal (hereinafter also referred to as "average noise power") or the electric power ratio (hereinafter also referred to as "signal-power-to-noise-power ratio") of desired signal power (for example, electric power corresponding to received signal) to noise power, although the Euclidean distance (hereinafter also simply referred to as a "distance") between the signal constellations is taken into consideration. In addition, with the receiver device of Patent Document 1, although branch metrics are calculated taking the positions of the symbols within the band into consideration, the average noise power corresponding to the noise component contained in the demodulated signal or the signal-to-noise power ratio is not taken into consideration.

Nevertheless, when receiving OFDM signal while in transit, the power of received signal changes greatly over time, and therefore, the average noise power or the signal-to-noise power ratio also varies over time. However, the Euclidean distance that is calculated from demodulated signal does not take into account the absolute amount of the average noise power contained in the demodulated signal or the signal-to-noise power ratio; thus, there has been a problem that the adverse effect caused by the power corresponding to the noise cannot be suppressed in decoding the demodulated signal and the error rate corresponding to the signal after decoding the demodulated signal cannot be made sufficiently small.

DISCLOSURE OF THE INVENTION

The present invention has been accomplished to resolve such a problem as described above, and its object is to obtain an OFDM signal receiver device that can lessen adverse effects from change over time in the average noise power or the signal-to-noise power ratio or from their absolute values by weighting branch metrics based on the average noise power or the signal-to-noise power ratio and performing Viterbi decoding based on the results of the weighting.

An embodiment of the OFDM signal receiver device comprises: a Fourier transform unit for performing a Fourier transform on a received OFDM signal and outputting a subcarrier component obtained as a result of the Fourier transform; a pilot extracting unit for extracting a pilot signal contained in the subcarrier component; a known signal generating unit for generating and outputting a known signal corresponding to the pilot signal; a first divider unit for dividing the pilot signal by the known signal and outputting a transmission channel characteristic corresponding to the pilot signal; an interpolation filter unit for calculating a transmission channel characteristic corresponding to the subcarrier component based on the transmission channel characteristic corresponding to the pilot signal; a second divider unit for dividing the subcarrier component output from the Fourier transform unit by the transmission channel characteristic output from the interpolation filter unit to output a demodulated signal; a noise power-calculating unit for calculating an electric power corresponding to a noise component contained in the demodulated signal based on the demodulated signal and outputting a noise power signal corresponding to a result of the calculation; a weighting factor-calculating unit for calculating a weighting factor for a branch metric based on the noise power signal and the transmission channel characteristic corresponding to the subcarrier component that is output from the interpolation filter unit; and a decoding unit for decoding the demodulated signal based on the weighting factor.

The embodiment of the OFDM signal receiver device according to the present invention makes possible Viterbi decoding taking noise power into account and can reduce error rate after decoding.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a configuration diagram of an OFDM signal receiver device according to a first preferred embodiment of the present invention.

BEST MODE FOR CARRYING OUT THE INVENTION

First Preferred Embodiment

Figure 2:
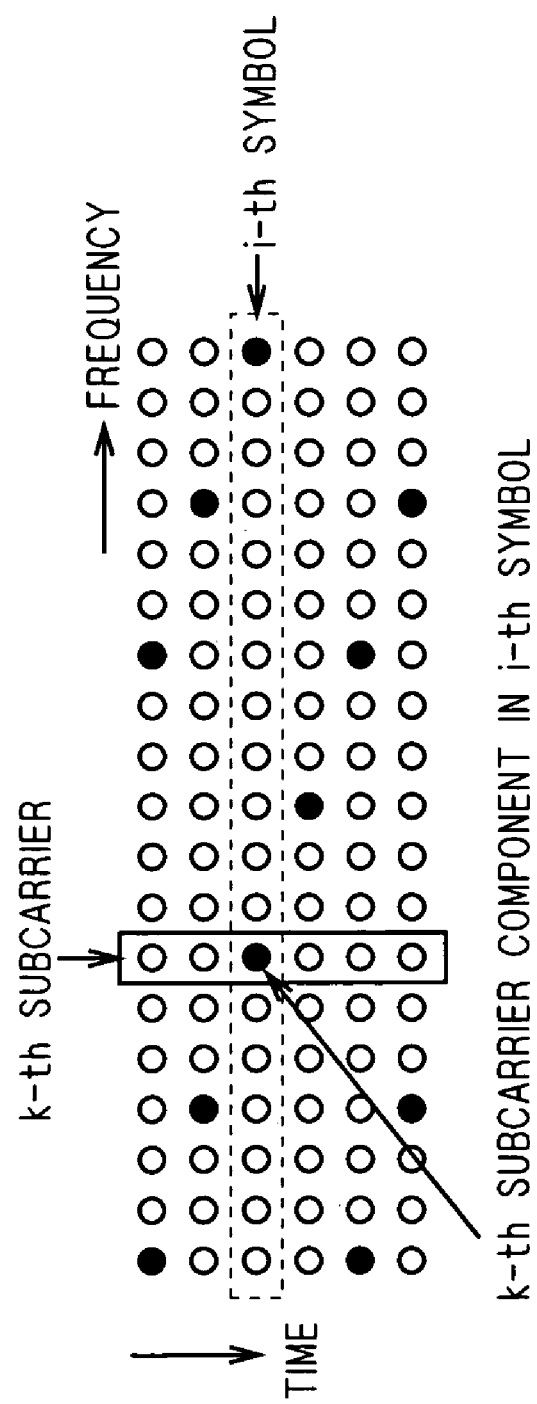
FIG. 2 is a conceptual diagram of an OFDM signal according to the first preferred embodiment of the present invention.

First, the transmission technology of orthogonal frequency division multiplexing system is explained. The orthogonal frequency division multiplexing system is a transmission system that uses a plurality of carrier waves (hereinafter also referred to as "subcarrier components") the frequencies of which are orthogonal to each other to transmit transmission data, and the transmission data are reproduced with a receiver device. This first preferred embodiment explains a case in which convolutionally coded transmission data are transmitted and received according to the orthogonal frequency division multiplexing format. In this case, in a transmission device, transmission data that are convolutionally coded at a predetermined coding rate are assigned a signal constellation according to the modulation format of each subcarrier component. Specifically, the transmission data are subjected to an inverse Fourier transform to generate a signal in which a plurality of subcarrier components are multiplexed, the frequencies of which are orthogonal to each other (the signal is hereinafter also referred to as "multiplex signal") and thereafter, a predetermined length of data interval from the tail end of the multiplex signal is added as a guard interval to the front edge of the multiplex signal to generate a transmission signal. Thereafter, the transmission signal is frequency-converted into a predetermined frequency band and transmitted.

On the other hand, in a receiver device, a received signal is frequency-converted into a predetermined frequency band, and the position of the guard interval is identified to establish synchronization. Thereafter, the received signal with which synchronization has been established is subjected to a Fourier transform to calculate each subcarrier component. Then, each subcarrier component is demodulated and thereafter Viterbi decoding is carried out to reproduce the transmission data.

For demodulation of the subcarrier component, variations between the amplitude and phase corresponding to the transmission signal and the amplitude and phase corresponding to the signal obtained as the result of the Fourier transform are calculated, and based on the result of the calculation, the signal constellation at the time of the transmission is reproduced. A well-known technique for realizing this procedure is a technique of transmitting a pilot signal, which is a known signal, using a specific subcarrier in order to calculate variations in the amplitude and phase. For example, in a digital terrestrial TV broadcasting system in Japan, a scattered pilot signal (hereinafter also referred to as a "pilot signal") is inserted every 12 subcarrier components along the frequency axis and every 4 symbols along the time axis. In the digital terrestrial TV broadcasting system in Japan, the receiver device performs demodulation of subcarrier based on the foregoing pilot signal.

FIG. 1 shows a configuration diagram of an OFDM signal receiver device according to the present preferred embodiment. Referring to FIG. 1, a signal obtained by frequency-converting a received OFDM signal into a predetermined signal band (hereinafter also referred to as "S1") is input into a Fourier transform unit 1. S1 that is input to the Fourier transform unit 1 undergoes a Fourier transform with predetermined timing, and the result of the Fourier transform is input to a pilot extracting unit 2 and a delay adjusting unit 6. The pilot extracting unit 2 extracts a received pilot signal contained in the received OFDM signal and outputs it to a first divider unit 4. A pilot signal that is inserted into the OFDM signal by the transmission device and corresponds to the received pilot signal, that is, a transmission pilot signal, is set in the receiver device in advance, and it is a known signal. A known signal generating unit 3 generates the transmission pilot signal that is the known signal and outputs it to the first divider unit 4. It should be noted that the known signal generating unit 3 generates the transmission pilot signal with the timing that is in synchronization with the output from the pilot extracting unit 2.

The first divider unit 4 divides the received pilot signal, which is the output of the pilot extracting unit 2, by the transmission pilot signal generated by the known signal generating unit 3 to calculate a transmission channel characteristic corresponding to each received pilot signal. At this stage, the calculated transmission channel characteristic is obtained only for the subcarrier component containing the received pilot signal. Therefore, in order to obtain the transmission channel characteristics for all the subcarrier components from the transmission channel characteristic corresponding to this received pilot signal, an interpolation process by means of filtering is necessary.

FIG. 2 shows a pilot signal arrangement according to a digital terrestrial wave TV broadcasting system in Japan. In FIG. 2, the horizontal axis represents frequency while the vertical axis represents time, and pilot signals are represented by black dots while the other subcarrier components are represented by white dots. In FIG. 2, a pilot signal is inserted every 12 symbols along the frequency axis and every 4 symbols along the time axis.

Accordingly, in order to calculate the transmission channel characteristics corresponding to all the subcarrier components from the transmission channel characteristics corresponding to these pilot signals, it is necessary to carry out an interpolation process for both the time axis and the frequency axis based on the transmission channel characteristics corresponding to the pilot signals. For that reason, the receiver device in the present preferred embodiment is provided with an interpolation filter unit 5 for the output of the first divider unit 4. The interpolation filter unit 5 performs the interpolation process along the time axis and the interpolation process along the frequency axis. Owing to this interpolation process, the transmission channel characteristics corresponding to all the subcarrier components can be estimated from the transmission channel characteristics corresponding to the pilot signals.

Figure 3:
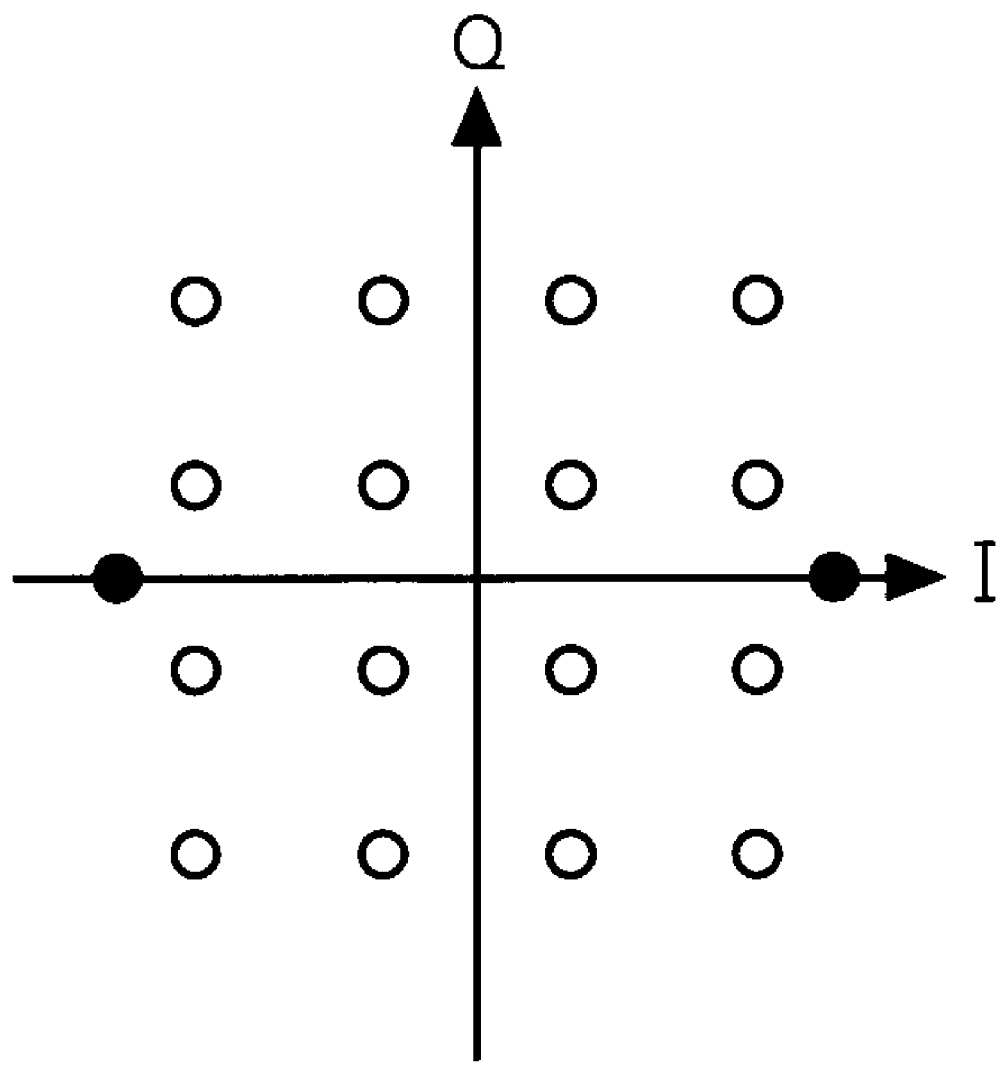
FIG. 3 is a signal point diagram of an OFDM signal according to the first preferred embodiment of the present invention.

On the other hand, in order to synchronize the transmission channel characteristic corresponding to each subcarrier component that is output from the interpolation filter unit 5 with each subcarrier component that is the output of the Fourier transform unit 1, the delay adjusting unit 6 delays each subcarrier component that is the output of the Fourier transform unit 1 by a predetermined time and outputs it to a second divider unit 7. Next, the second divider unit 7 divides each subcarrier component that is delayed by the delay adjusting unit 6 by the transmission channel characteristic corresponding to each subcarrier component that is output from the interpolation filter unit 5 to demodulate each of the delayed subcarrier components. It should be noted that the output of the second divider unit 7 is a subcarrier component obtained by subjecting the output of the Fourier transform unit 1 to amplitude correction and phase correction. Here, FIG. 3 shows a plan view of signal points of subcarrier components according to the present preferred embodiment. In FIG. 3, the horizontal axis represents a real axis I while the vertical axis represents an imaginary axis Q, and pilot signals are represented by black dots while the other subcarrier components are represented by white dots. In addition, FIG. 3 shows a case in which the pilot signals are transmitted by BPSK (Binary Phase Shift Keying) and the other subcarrier components are transmitted by 16 QAM (Quadrature Amplitude Modulation).

The distance, or the squared value of the distance, between a point on the signal point plane of a pilot signal that is output from the second divider unit 7 and a point on a signal point plane of a transmission pilot signal increases proportional to the noise power in a demodulated signal. For that reason, the receiver device of the present preferred embodiment is provided with a first noise power-calculating unit 8 downstream of the second divider unit 7. The noise power-calculating unit 8 generates a noise power signal that is proportional to the average noise power or the signal-to-noise power ratio corresponding to the demodulated signal. It should be noted that the following discussion explains a case in which, of the above-mentioned average noise power and the above-mentioned signal-to-noise power ratio, the average noise power is used as a basis for the weighting of branch metrics.

Figure 4:
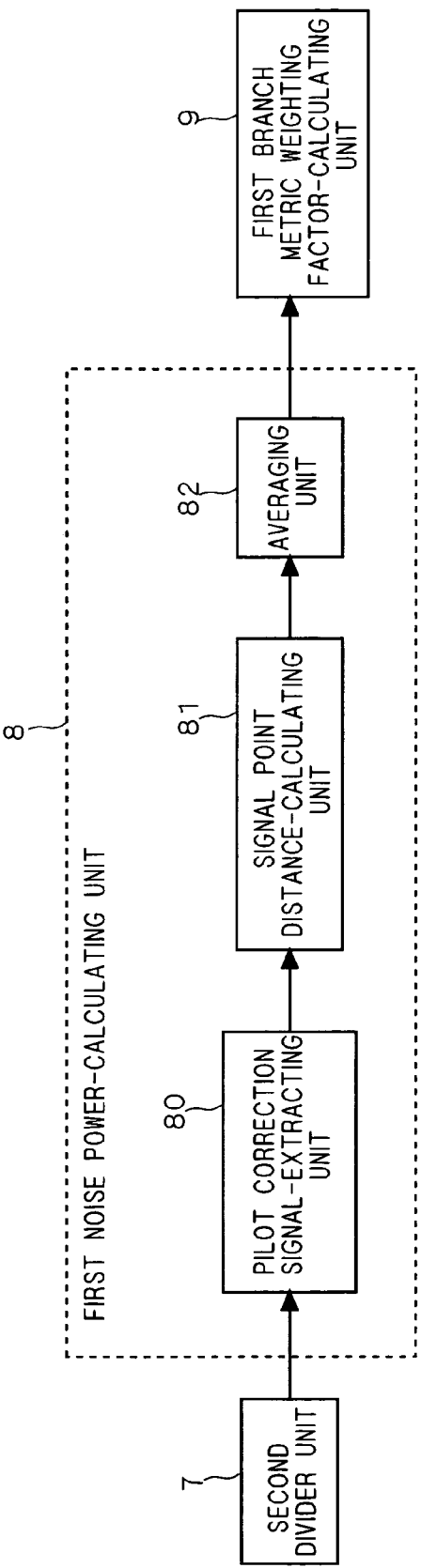
FIG. 4 is a configuration diagram of a noise power-calculating unit according to the first preferred embodiment of the present invention.

FIG. 4 shows a configuration diagram of the first noise power-calculating unit 8 in the receiver device of the present preferred embodiment. Referring to FIG. 4, the output from the second divider unit 7 is input into a pilot correction signal-extracting unit 80. The pilot correction signal-extracting unit 80 extracts a pilot signal from the subcarrier component that is output from the second divider unit 7 and outputs the pilot signal to a signal point distance-calculating unit 81. The signal point distance-calculating unit 81 calculates the distance, or the squared value of the distance, between a point on the signal point plane of the pilot signal that is output from the pilot correction signal-extracting unit 80 and a point on the signal point plane of the transmission pilot signal, and outputs it to an averaging unit 82. The averaging unit 82 calculates an average value of the distances, or the squared values of the distances, between the signal points corresponding to the pilot signals that are output from the signal point distance-calculating unit 81, and outputs a signal corresponding to the average value to a first branch metric weighting factor-calculating unit 9, as a noise power signal corresponding to the average noise power of the demodulated signal. It should be noted that the greater the average noise power in a demodulated signal is, the greater the intensity (amplitude value) of the signal that is output from the first noise power-calculating unit 8.

Figure 5:
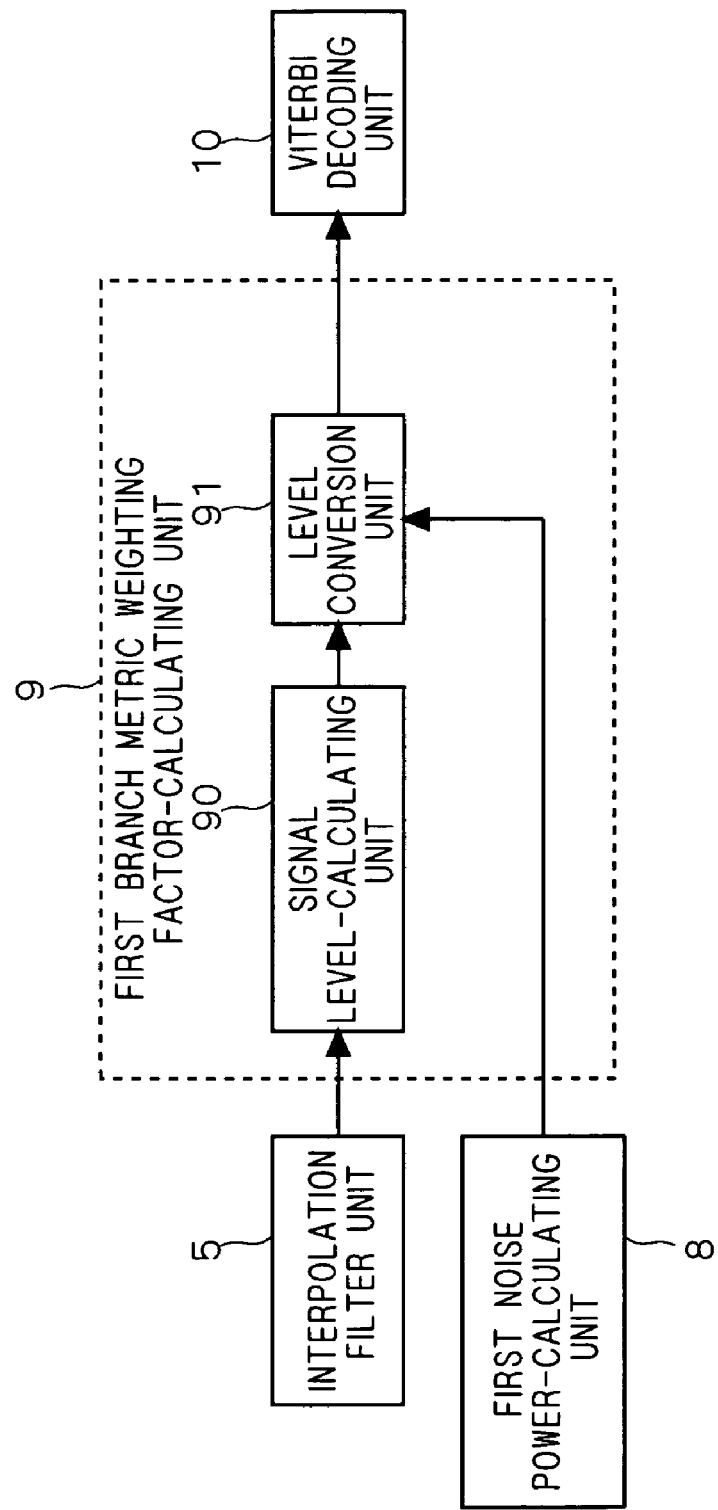
FIG. 5 is a configuration diagram of a branch metric weighting factor-calculating unit according to the first preferred embodiment of the present invention.

The first branch metric weighting factor-calculating unit 9 calculates weighting factors for the branch metrics to be used in Viterbi decoding, from the transmission channel characteristics corresponding to the subcarrier components that are output from the interpolation filter unit 5 and the noise power signal that is output from the first noise power-calculating unit 8. FIG. 5 shows a configuration diagram of the first branch metric weighting factor-calculating unit 9 according to the present preferred embodiment. Referring to FIG. 5, the transmission channel characteristics from the interpolation filter unit 5 are input into a signal level-calculating unit 90. This signal level-calculating unit 90 calculates the amplitude, or the squared value of the amplitude, of each subcarrier component (which is hereinafter also referred to as "transmission channel characteristic power information") based on the transmission channel characteristics that are output from the interpolation filter unit 5. The transmission channel characteristic power information calculated by the signal level-calculating unit 90 is input into a level conversion unit 91. This level conversion unit 91 multiplies the transmission channel characteristic power information from the signal level-calculating unit 90 by a coefficient according to the noise power signal from the first noise power-calculating unit 8, and further adds an offset value thereto to calculate a weighting factor for a branch metric.

Herein, the offset value is a value for fine adjustment that is performed to alleviate the adverse effects originating from the rounding or bit limitation in actually configuring hardware. It should be noted that the optimum value of the coefficient by which the transmission channel characteristic power information is multiplied and the optimum value of the offset value that is to be added may be obtained by measuring error rates after demodulation while changing various conditions of received signal using a simulator or an actually manufactured piece of hardware.

The weighting factor calculated by the first branch metric weighting factor-calculating unit 9 is input into a Viterbi decoding unit 10. This Viterbi decoding unit 10 calculates branch metrics corresponding to the subcarrier components that are output from the second divider unit 7 based on the weighting factors that are output from the first branch metric weighting factor-calculating unit 9, selects a path that results in the least value among the accumulated totals of the branch metrics, and outputs a decoded signal (hereinafter also referred to as "S2").

Figure 6:
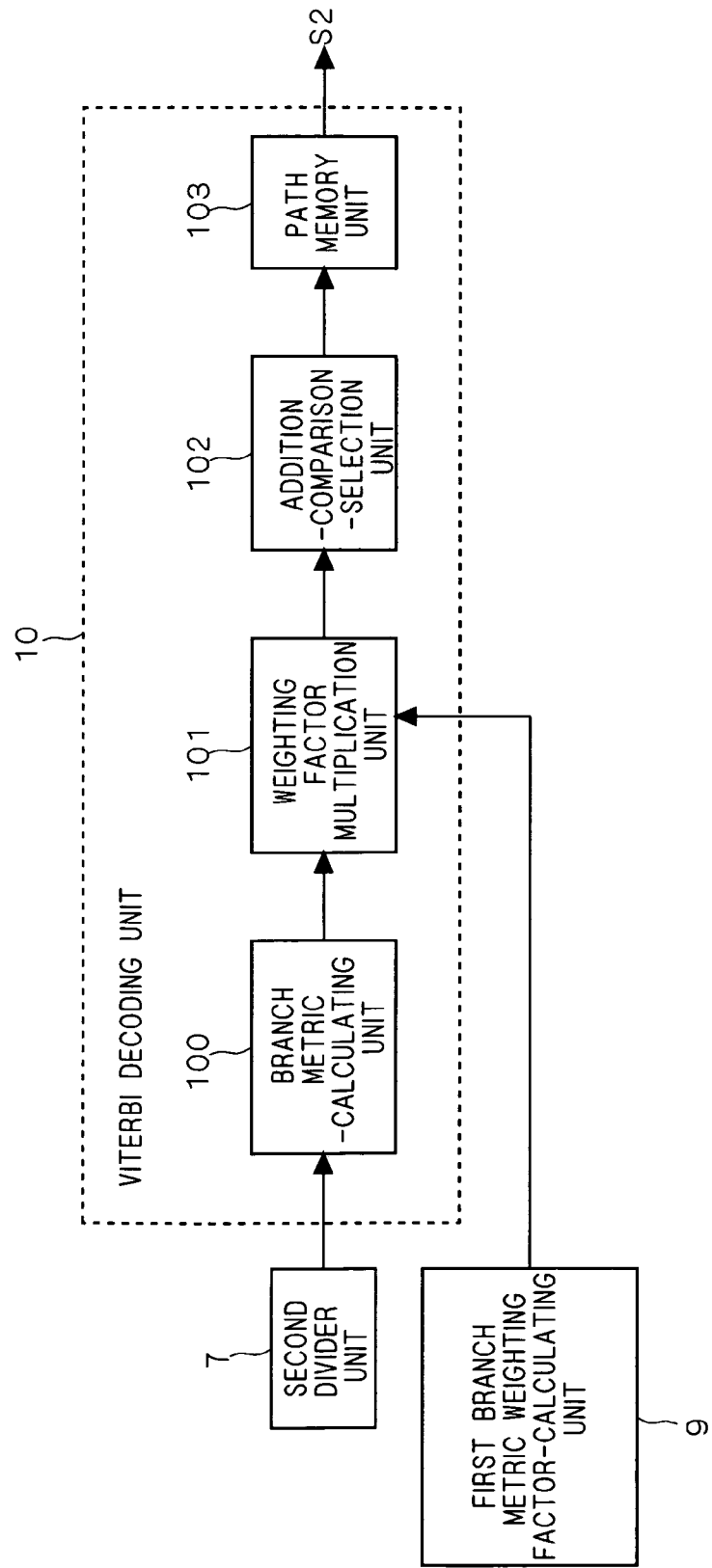
FIG. 6 is a configuration diagram of a Viterbi decoding unit according to the first preferred embodiment of the present invention.

FIG. 6 shows a configuration diagram of the Viterbi decoding unit 10 according to the present preferred embodiment. Referring to FIG. 6, the subcarrier components that are output from the second divider unit 7 are input into a branch metric-calculating unit 100. This branch metric-calculating unit 100 obtains a distance between a signal point of a demodulated subcarrier component and a signal point corresponding to each symbol that is uniquely determined by the modulation format corresponding to the received signal, and calculates a predetermined number of branch metrics that are determined by the configuration of the convolutional encoder in the transmission device. The branch metrics calculated by the branch metric-calculating unit 100 are input into a weighting factor multiplication unit 101. The weighting factor multiplication unit 101 multiplies each of the branch metrics that is input from the branch metric-calculating unit 100 by the weighting factor calculated by the first branch metric weighting factor-calculating unit 9. The accumulated total of the branch metrics multiplied by the weighting factor is obtained in an addition/comparison/selection unit 102, and a plurality of paths are calculated. The addition/comparison/selection unit 102 compares the calculated paths and selects the path that results in the least value. The result of the accumulated total of the branch metrics for this selected path is stored in a path memory unit 103 as a surviving path metric. This path memory unit 103 stores the surviving path metric and outputs the information series corresponding to this path metric as a decoded signal.

As described above, the receiver device according to the present preferred embodiment makes possible Viterbi decoding taking noise power into consideration and can reduce the error rate after decoding.

Second Preferred Embodiment

The receiver device in the first preferred embodiment generates a noise power signal based on a demodulated pilot signal, and calculates a weighting factor for a branch metric based on the resultant noise power signal. A receiver device in the present preferred embodiment generates a noise power signal from an input level of a received signal, and calculates a weighting factor for a branch metric based on the resultant noise power signal.

Figure 7:
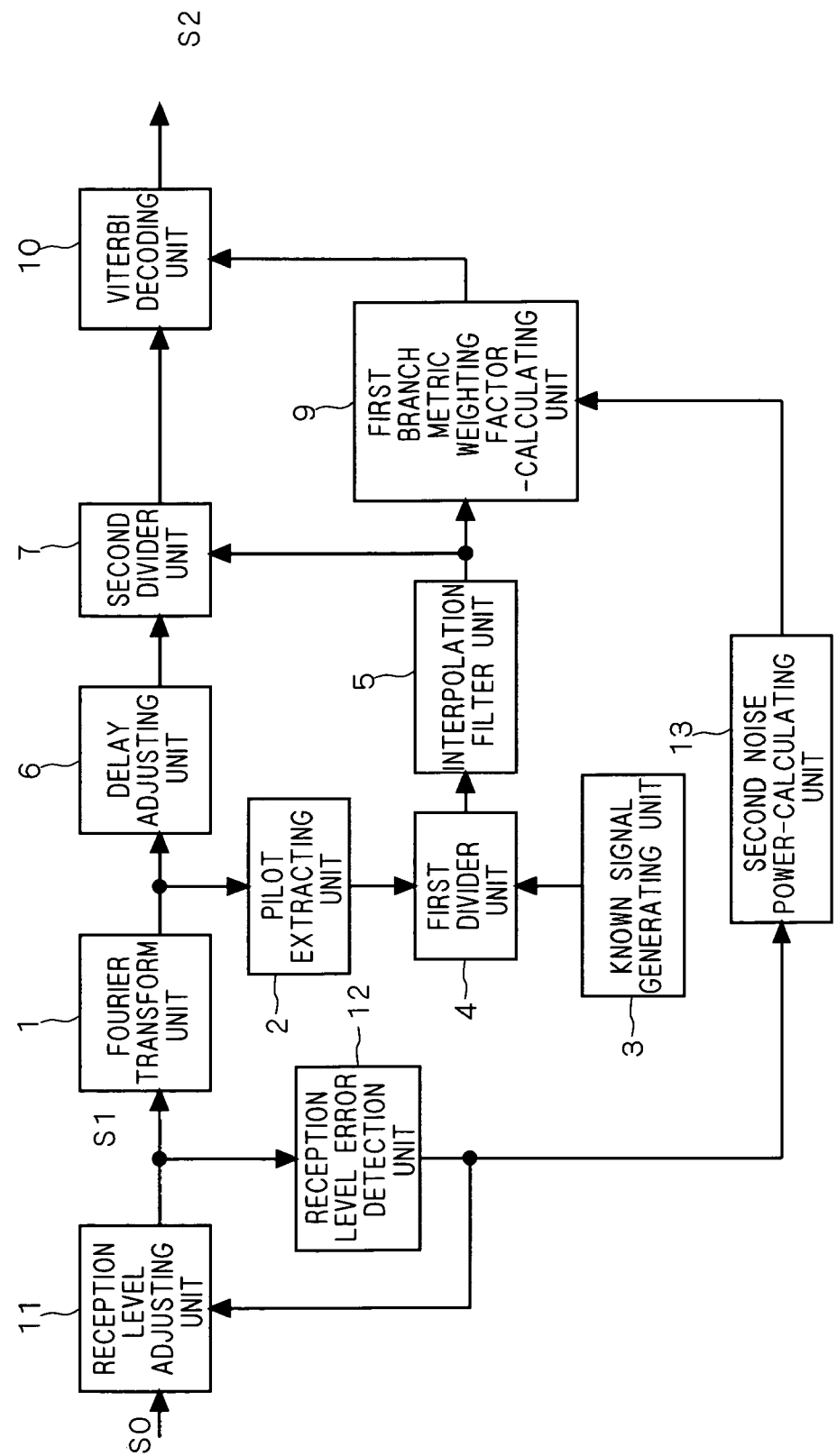
FIG. 7 is a configuration diagram of an OFDM signal receiver device according to a second preferred embodiment of the present invention.

FIG. 7 shows a configuration diagram of the receiver device according to the present preferred embodiment. The receiver device shown in FIG. 7 employs: a Fourier transform unit 1, a pilot extracting unit 2, a known signal generating unit 3, a first divider unit 4, an interpolation filter unit 5, a delay adjusting unit 6, a second divider unit 7, a first branch metric weighting factor-calculating unit 9, and a Viterbi decoding unit 10; and these components have the same functions as those in the first preferred embodiment. For that reason, these components are designated by the same reference numerals as those used in the first preferred embodiment and the explanations thereof are omitted. The receiver device in the present preferred embodiment comprises a reception level adjusting unit 11, a reception level error detection unit 12, and a second noise power-calculating unit 13 for outputting a noise power signal based on the outputs of the reception level adjusting unit 11 and the reception level error detection unit 12. It should be noted that the receiver device of the present preferred embodiment is provided with the second noise power-calculating unit 13 and is therefore not provided with the first noise power-calculating unit 8 as in the receiver device of the first preferred embodiment.

A received signal that transmitted a transmission channel and has just been received by the receiver device (hereinafter also referred to as "S0") is a signal that has not yet been frequency-converted into a predetermined frequency band or not been adjusted to a desired signal level. This S0 is input into the reception level adjusting unit 11. This reception level adjusting unit 11 adjusts the signal level of S0 to a desired level based on a signal that is output from the reception level error detection unit 12 (which is hereinafter also referred to as a "gain adjusting signal"). The reception level error detection unit 12 calculates the power of the output signal of the reception level adjusting unit 11 and compares the power with a predetermined level to detect a level error. Furthermore, the reception level error detection unit 12 suppresses the high frequency component within the detection result of the level error by a filter, and outputs the resultant signal to the reception level adjusting unit 11 as the gain adjusting signal. It should be noted that this circuit, constructed by the reception level adjusting unit 11 and the reception level error detection unit 12, is commonly known as an AGC (Automatic Gain Control) circuit.

In the receiver device of the present preferred embodiment, the gain adjusting signal that is output from the reception level error detection unit 12 is also input into the second noise power-calculating unit 13. This second noise power-calculating unit 13 outputs a noise power signal corresponding to a received signal based on the gain adjusting signal that is output from the reception level error detection unit 13. Specifically, when the signal power of S0 is less than a desired level, the reception level adjusting unit 11 amplifies the signal level; at this point, since the noise component is similarly amplified, the average noise power corresponding to S1 becomes relatively large. Conversely, when the signal power of S0 is large, the amplification degree of the signal reduces; accordingly, the amplification degree of the noise component becomes small, and the average noise power in S1 becomes relatively small. Thus, the relative value of average noise power can be estimated from the magnitude of the gain adjusting signal.

As an example of the configuration of the second noise power-calculating unit 13, it is conceivable to employ a configuration in which a table for converting a gain adjusting signal into a noise power signal is provided and, based on the table, a noise power signal is output to the first branch metric weighting factor-calculating unit 9. When a gain adjusting signal is such that the amplification degree of S0 becomes large, it can be inferred that the average noise power will be large and therefore the noise power signal is set to be a large value in the table. On the other hand, when a gain adjusting signal is such that the amplification degree of S0 becomes small, it can be inferred that the average noise power will be small and therefore the noise power signal is set to be a small value in the table.

As described above, the receiver device according to the present preferred embodiment makes possible Viterbi decoding taking average noise power into consideration and can reduce the error rate after decoding.

Third Preferred Embodiment

The receiver device in the first preferred embodiment calculates a weighting factor for a branch metric by calculating the transmission channel characteristic power information of each subcarrier component from the output of the interpolation filter 5 with the first branch metric weighting factor-calculating unit 9, multiplying this transmission channel characteristic power information by a coefficient according to a noise power signal, and further adding an offset value thereto. The receiver device in present preferred embodiment calculates a weighting factor for a branch metric by performing a signal conversion on the transmission channel characteristic power information using a predetermined function, multiplying the signal that has undergone the conversion by a coefficient according to a noise power signal, and further adding an offset value thereto.

Figure 8:
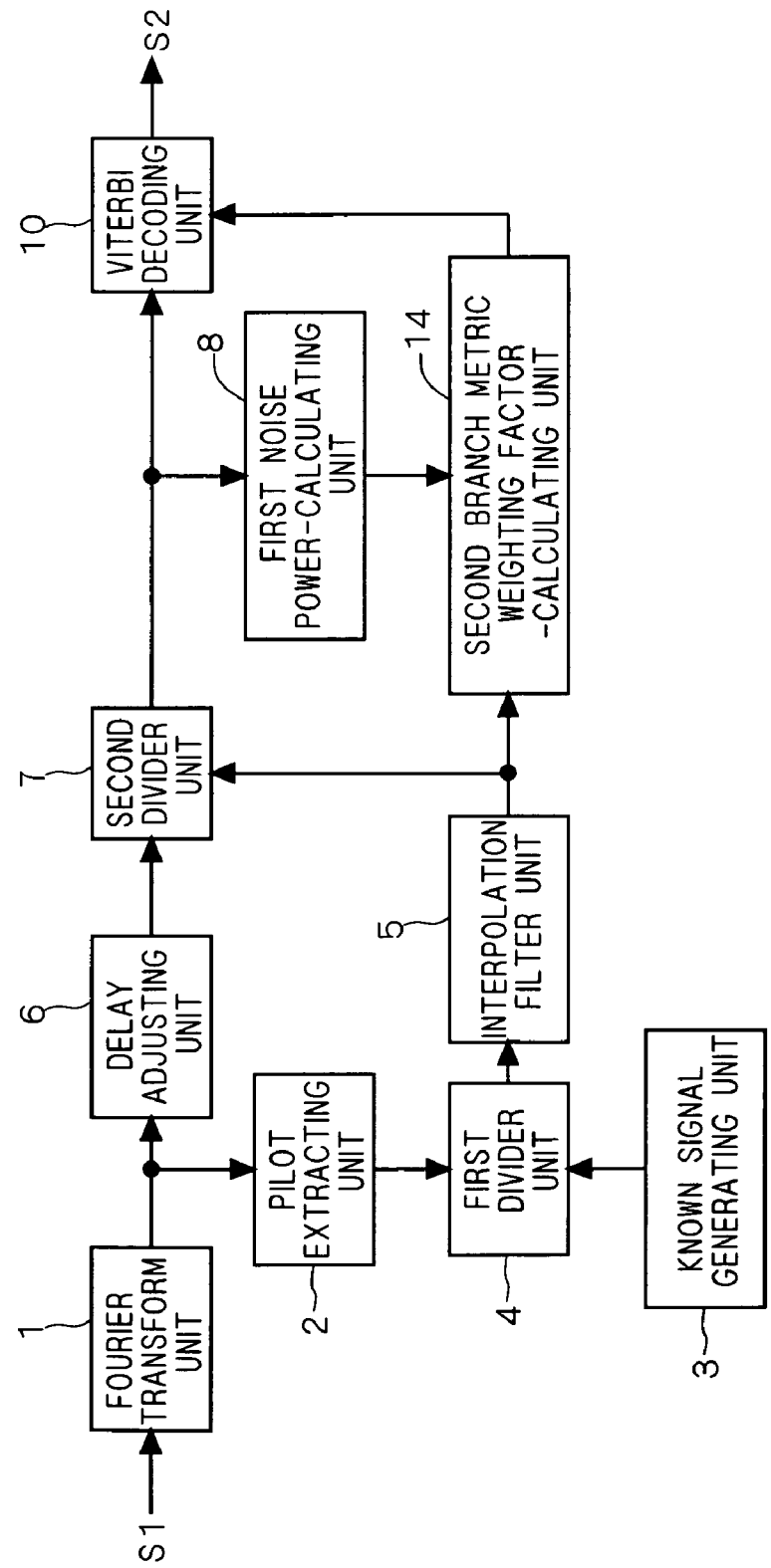
FIG. 8 is a configuration diagram of an OFDM signal receiver device according to a third preferred embodiment of the present invention.

FIG. 8 shows a configuration diagram of the receiver device according to the present preferred embodiment. The receiver device shown in FIG. 8 employs the following components: a Fourier transform unit 1, a pilot extracting unit 2, a known signal generating unit 3, a first divider unit 4, an interpolation filter unit 5, a delay adjusting unit 6, a second divider unit 7, a first noise power-calculating unit 8, and a Viterbi decoding unit 10, and these components have the same functions as those in the first preferred embodiment. For this reason, these components are designated by the same reference numerals as those used in the first preferred embodiment and the explanations thereof are omitted. It should be noted that the receiver device of the present preferred embodiment is provided with a second branch metric weighting factor-calculating unit 14 and is therefore not provided with the first branch metric weighting factor-calculating unit 9 as in the receiver device according to the first preferred embodiment.

Figure 9:
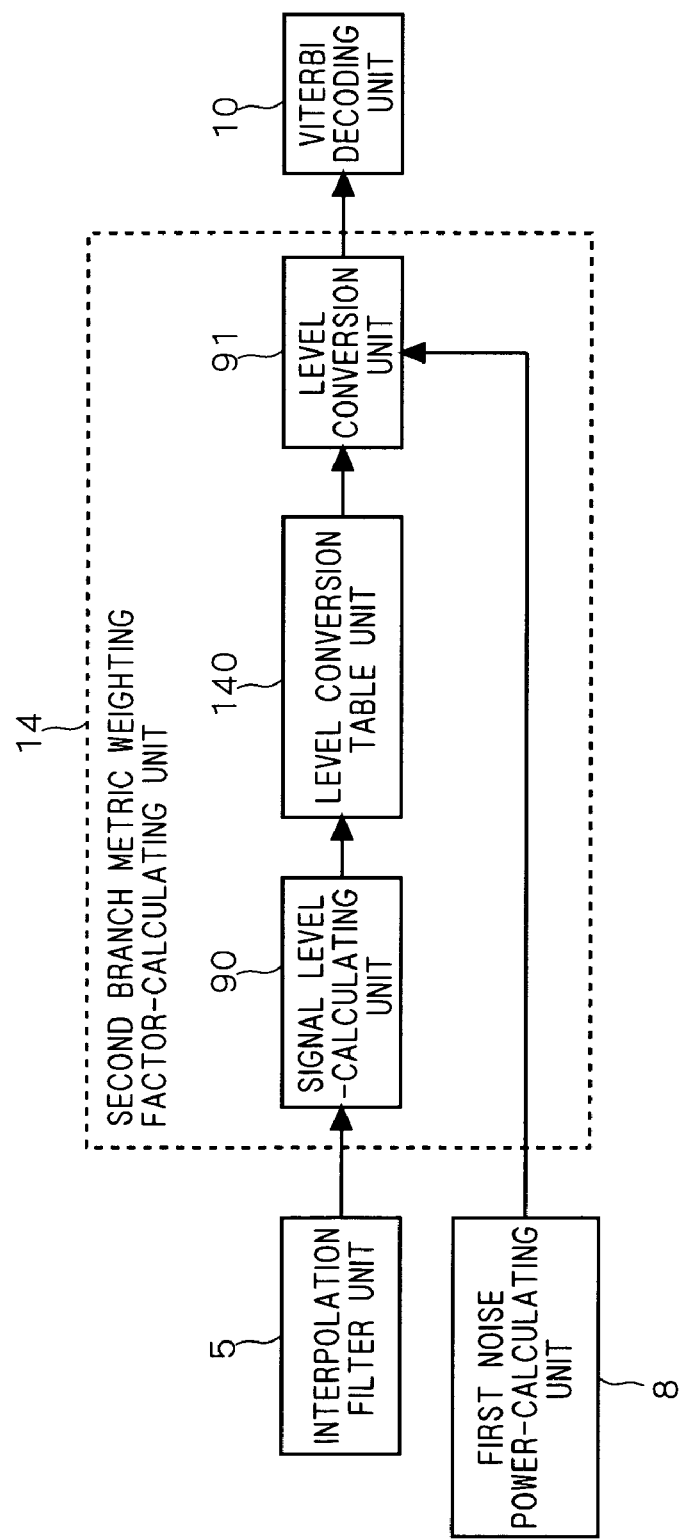
FIG. 9 is a configuration diagram of a branch metric weighting factor-calculating unit according to the third preferred embodiment of the present invention.

The second branch metric weighting factor-calculating unit 14 calculates a weighting factor for a branch metric used for the Viterbi decoding unit 10, from the output of the interpolation filter unit 5 and the output of the first noise power-calculating unit 8. It should be noted that the second branch metric weighting factor-calculating unit 14 differs from the first branch metric weighting factor-calculating unit 9 in the respect that the second branch metric weighting factor-calculating unit 14 performs a signal conversion on the transmission channel characteristic power information obtained from the output of the interpolation filter unit 5 using a predetermined function. FIG. 9 shows a configuration diagram of the second branch metric weighting factor-calculating unit 14 according to the present preferred embodiment.

Referring to FIG. 9, the transmission channel characteristics that are output from the interpolation filter unit 5 are input into a signal level-calculating unit 90. This signal level-calculating unit 90 calculates transmission channel characteristic power information corresponding to each subcarrier component based on the transmission channel characteristics that are output from the interpolation filter unit 5. The transmission channel characteristic power information that is calculated by the signal level-calculating unit 90 is input into a level conversion table unit 140. This level conversion table unit 140 functions as a level conversion reference unit for converting the transmission channel characteristic power information that is output from the signal level-calculating unit 90 according to a predetermined conversion criterion. As an example of the configuration of the level conversion table unit 140, such a conversion table may be provided in the level conversion table unit 140 that stores output values associated with signals corresponding to the transmission channel characteristic power information using a predetermined function that is set as the foregoing conversion criterion so that the output values are output according to the foregoing transmission channel characteristic power information that is input thereto.

Figure 10:
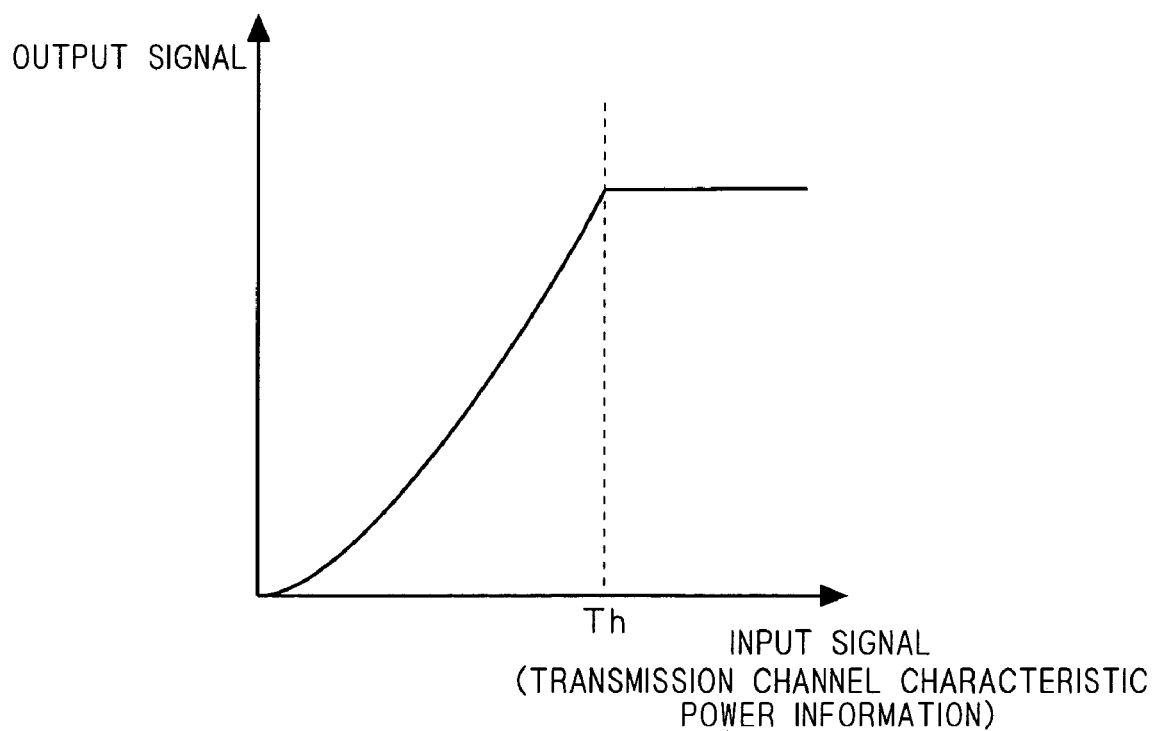
FIG. 10 is a graph illustrating a function of a level conversion table according to the third preferred embodiment of the present invention.

As this function, it is possible to use a nonlinear function as shown in FIG. 10, for example. In FIG. 10, the horizontal axis represents signal values corresponding to transmission channel characteristic power information, which is the input signal, (for example, power values) and the vertical axis represents signal values corresponding to the transmission channel characteristic power information after the conversion, which is the output signal (for example, power values). In FIG. 10, there exists a portion in which the output signal is clipped with respect to a large input signal (a portion greater than Th in FIG. 10). This portion can be considered as a portion in which the error rate after decoding will not suffer greatly even if the weighting factor is not made large because the transmission channel characteristic power information is at a certain level or higher and the reliability of the information to be decoded is sufficiently high. Moreover, by setting the weighting factor not to be large but to be a constant value, there is an advantage that the bit number of the weighting factor can be restricted and the circuit scale can be reduced.

Furthermore, FIG. 10 shows a nonlinear curve such that the smaller the input signal is, the smaller the output signal. The reason is that setting a weighting factor to be smaller offers an advantage that the error rate after decoding can be reduced further, because the reliability of the information to be decoded is low when the signal corresponding to transmission channel characteristic power information is small. The function that may be used in the conversion table is not limited to the function shown in FIG. 10, and an optimum function should be applied thereto by measuring error rates after demodulation while changing various conditions of received signal using a simulator or an actually manufactured piece of hardware.

The signal converted at the level conversion table unit 140 is input into a level conversion unit 91. This level conversion unit 91 multiplies a signal converted at the level conversion table unit 140 by a coefficient according to the noise power signal from the first noise power-calculating unit 8, and further adds an offset value to calculate a weighting factor for a branch metric. Additionally, the coefficient by which the signal converted by the level conversion table unit 140 and the offset value that is to be added may be optimized by measuring error rates after demodulation while changing various conditions of received signal using a simulator or an actually manufactured piece of hardware.

As described above, the receiver device according to the present preferred embodiment makes possible a desired signal conversion on transmission channel characteristic power information and can reduce the error rate after decoding.

Fourth Preferred Embodiment

The receiver device in the first preferred embodiment calculates a weighting factor for a branch metric irrespective of the modulation format or coding rate of a subcarrier component. The receiver device in the present preferred embodiment calculates an optimum weighting factor for a branch metric taking the modulation format or coding rate of a subcarrier component into consideration.

Figure 11:
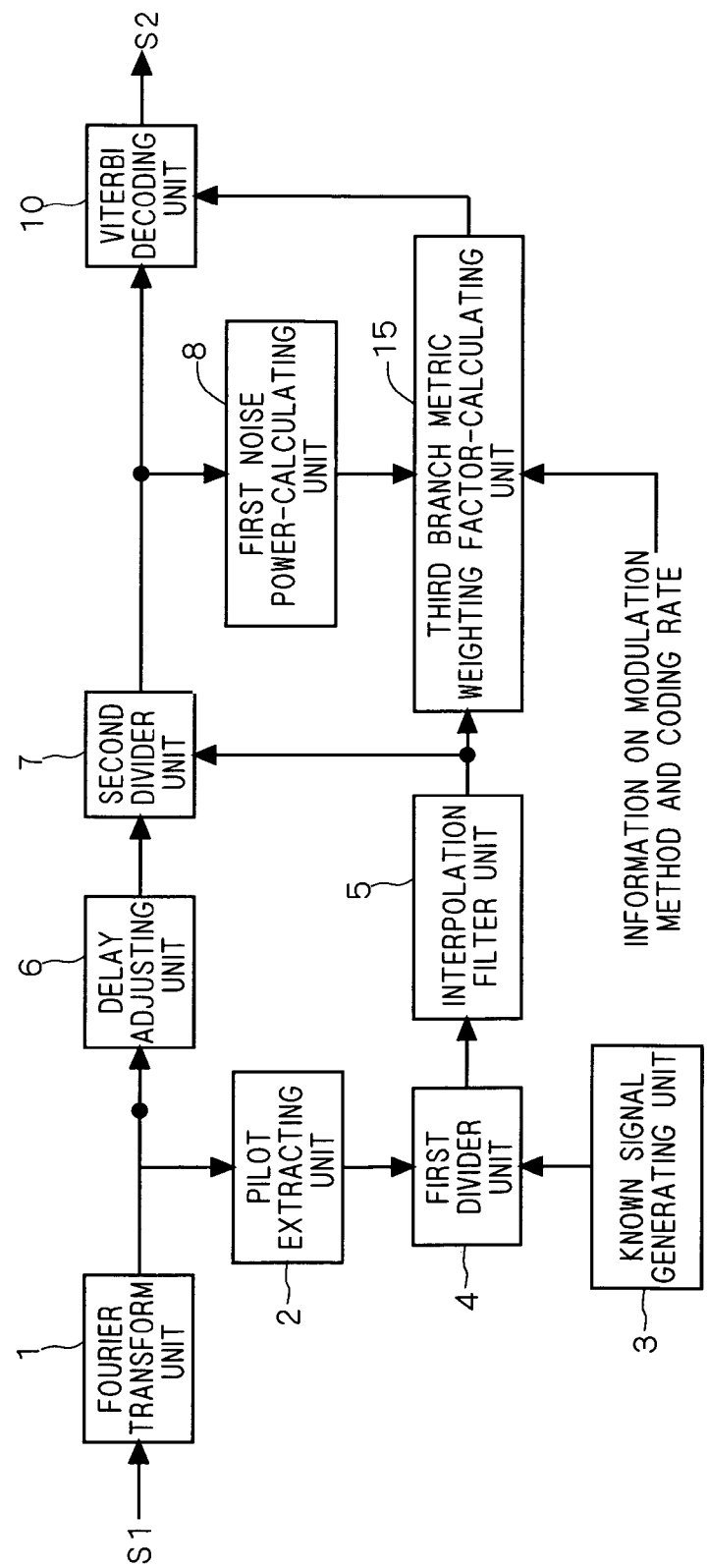
FIG. 11 is a configuration diagram of an OFDM signal receiver device according to a fourth preferred embodiment of the present invention.

FIG. 11 shows a configuration diagram of the receiver device according to the present preferred embodiment. The receiver device shown in FIG. 11 employs the following components: a Fourier transform unit 1, a pilot extracting unit 2, a known signal generating unit 3, a first divider unit 4, an interpolation filter unit 5, a delay adjusting unit 6, a second divider unit 7, a first noise power-calculating unit 8, and a Viterbi decoding unit 10, and these components have the same functions as those in the first preferred embodiment. For this reason, these components are designated by the same reference numerals as those used in the first preferred embodiment and the explanations thereof are omitted. It should be noted that the receiver device of the present preferred embodiment is provided with a third branch metric weighting factor-calculating unit 15 and is therefore not provided with the first branch metric weighting factor-calculating unit 9 as in the receiver device according to the first preferred embodiment.

Figure 12:
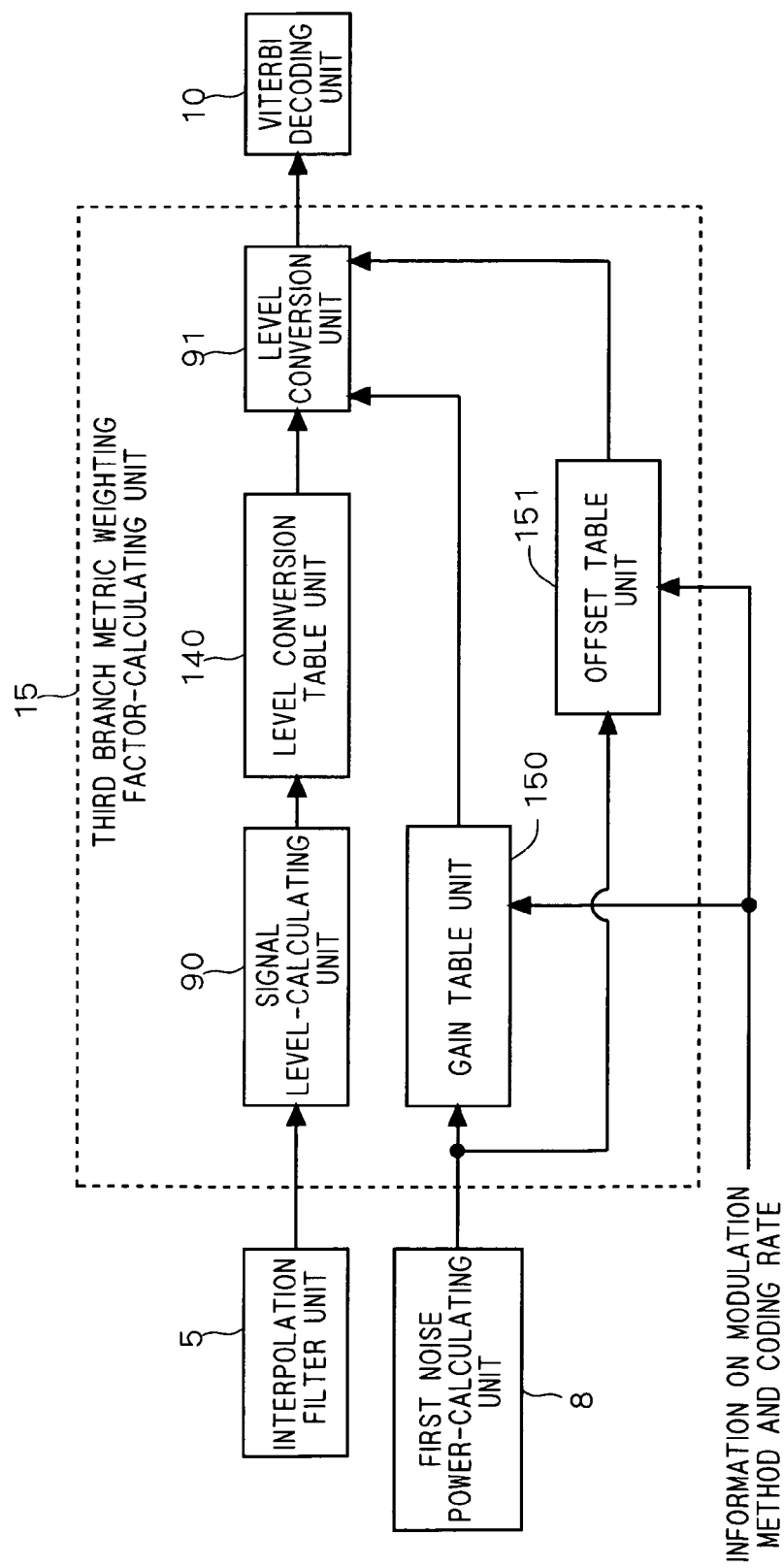
FIG. 12 is a configuration diagram of a branch metric weighting factor-calculating unit according to the fourth preferred embodiment of the present invention.

The third branch metric weighting factor-calculating unit 15 calculates a weighting factor for a branch metric used for the Viterbi decoding unit 10 from the output of the interpolation filter unit 5 and the output of the first noise power-calculating unit 8, taking the modulation format or coding rate of a subcarrier component into consideration. FIG. 12 shows a configuration diagram of the third branch metric weighting factor-calculating unit 15 according to the present preferred embodiment.

Referring to FIG. 12, a transmission channel characteristic that is output from the interpolation filter unit 5 is input into a signal level-calculating unit 90. This signal level-calculating unit 90 calculates transmission channel characteristic power information corresponding to each subcarrier component based on the transmission channel characteristic that is output from the interpolation filter unit 5. The transmission channel characteristic power information calculated by the signal level-calculating unit 90 is input into a level conversion table unit 140. This level conversion table unit 140 converts the transmission channel characteristic power information that is output from the signal level-calculating unit 90 according to a conversion table. In the conversion table, output values that are associated with signals corresponding to transmission channel characteristic power information by a predetermined function are stored in advance.

The signal obtained by converting power information at the level conversion table unit 140 is input into a level conversion unit 91. The level conversion unit 91 multiplies the signal obtained by the conversion at the level conversion table unit 140 by a coefficient according to the output from a gain table unit 150, and further adds an offset value according to the output of an offset table unit 151. Here, the gain table unit 150 is an adjusting unit having the function to adjust the output of the first noise power-calculating unit 8 according to the information on the modulation format or coding rate and to output the resultant value to the level conversion unit 91. The offset table unit 151 is an adjusting unit having the function for adjusting the output of the first noise power-calculating unit 8 according to the information corresponding to the modulation format or coding rate and for outputting the resultant value to the level conversion unit 91.

The foregoing information corresponding to the modulation format or the coding rate may be extracted from a received signal and input into the gain table unit 150 if the received signal contains the information corresponding to the modulation format or the coding rate; or alternatively, the foregoing information may be preset in the gain table unit 150 in advance if the modulation format or the coding rate used is already known in the transmission device. In addition, the conversion table, function, or the like used in the adjustment at the gain table unit 150 and the offset table unit 151 is required to measure the error rate after demodulation while changing various conditions of received signal using a simulator or an actually constructed piece of hardware. Herein, examples of the modulation format include QPSK, 64QAM, etc., and examples of the coding rate include 1/2, 7/8, etc.

As described above, the receiver device according to the present preferred embodiment is capable of optimizing a weighting factor for a branch metric according to the modulation format of subcarrier components and the coding rate of convolutional codes, and it can reduce the error rate after decoding by appropriately handling the signals that are transmitted using various modulation formats or coding rates.

It should be noted that although the present preferred embodiment has illustrated the case in which the receiver device is provided with the level conversion table unit 140, the same effects may be obtained even without providing the level conversion table unit 140 for the receiver device.

Moreover, although the first to the fourth preferred embodiments have illustrated the cases in which the receiver devices carry out weighting for the branch metrics based on the average noise power, the same effects as attained by the receiver devices in the first to the fourth preferred embodiments can be obtained by utilizing the signal-to-noise power ratio in the same way as with the average noise power.

Furthermore, although the first to the fourth preferred embodiments have illustrated the cases of the OFDM system used for a digital terrestrial wave TV broadcasting system in Japan, the receiver devices according to the first to the fourth preferred embodiments may be applied to other systems than the OFDM system as long as such systems performs demodulation based on a predetermined known signal.

While the invention has been shown and described in detail, the foregoing description is in all aspects illustrative and not restrictive. It is therefore understood that numerous other modifications and variations can be devised without departing from the scope of the invention.

What is claimed is:

1. An OFDM signal receiver device comprising:
a Fourier transform unit for performing a Fourier transform on a received OFDM signal and outputting a subcarrier component obtained as a result of said Fourier transform;
a pilot extracting unit for extracting a pilot signal contained in said subcarrier component;
a known signal generating unit for generating and outputting a known signal corresponding to said pilot signal;
a first divider unit for dividing said pilot signal by said known signal and outputting a transmission channel characteristic corresponding to said pilot signal;
an interpolation filter unit for calculating a transmission channel characteristic corresponding to said subcarrier component based on said transmission channel characteristic corresponding to said pilot signal;
a second divider unit for dividing said subcarrier component output from said Fourier transform unit by said transmission channel characteristic output from said interpolation filter unit to output a demodulated signal;
a noise power-calculating unit for calculating an electric power corresponding to a noise component contained in said demodulated signal based on said demodulated signal and outputting a noise power signal corresponding to a result of said calculation;
a weighting factor-calculating unit for calculating a weighting factor for a branch metric based on said noise power signal and said transmission channel characteristic corresponding to said subcarrier component that is output from said interpolation filter unit; and
a decoding unit for decoding said demodulated signal based on said weighting factor.

2. An OFDM signal receiver device comprising:
an interpolation filter for calculating a transmission channel characteristic corresponding to a subcarrier component which is contained in a received OFDM signal based on said transmission channel characteristic calculated based on a pilot signal in said subcarrier component and a known signal;

a noise power-calculating unit for calculating an electric power corresponding to a noise component which is contained said received OFDM signal; and a weighting factor-calculating unit for calculating a weighting factor for a branch metric based on said transmission channel characteristic calculated by said interpolation filter and said electric power calculated by said noise power-calculating unit.

3. The OFDM signal receiver device according to claim 1, wherein said noise power-calculating unit comprises:

a pilot correction signal-extracting unit for extracting a pilot signal contained in said demodulated signal;

a signal point distance-calculating unit for calculating a distance between a signal point of said extracted pilot signal and a signal point of said known signal, or a squared value of said distance; and an averaging unit for calculating an average value of said distance or said squared value of said distance corresponding to each said pilot signal calculated in said signal point distance-calculating unit and outputting a signal corresponding to a result of said calculation as said noise power signal.

4. The OFDM signal receiver device according to claim 2, wherein said noise power-calculating unit calculates a power value corresponding to a noise component contained in said OFDM signal and based on a signal corresponding to a difference between a power value corresponding to said received OFDM signal and a predetermined threshold value, and outputs as said noise power signal a signal corresponding to a result of said calculation.

5. The OFDM signal receiver device according claim 1, wherein said weighting factor-calculating unit comprises:

a signal level-calculating unit for calculating and outputting an amplitude or a squared amplitude of a signal corresponding to said subcarrier component based on said transmission channel characteristic corresponding to said subcarrier component; and a level conversion unit for multiplying said amplitude or said squared amplitude by a predetermined coefficient according to said noise power signal, and outputting, as said weighting factor, a result obtained by adding a predetermined offset to a result of the multiplication.

6. The OFDM signal receiver device according to claim 5, wherein said weighting factor-calculating unit further comprises:

a level conversion reference unit configured to include a conversion table storing an output value that is associated with said amplitude or said squared amplitude by a predetermined function; and wherein said level conversion unit multiplies said output value output from said level conversion reference unit by said predetermined coefficient, and outputs, as said weighting factor, a result obtained by adding said predetermined offset to a result of said multiplication.

7. The OFDM signal receiver device according to claim 6, wherein said predetermined function is a nonlinear function; and if said amplitude or said squared amplitude is less than a predetermined value, said level conversion reference unit outputs, as said output value, a smaller value than an output value that is to be output when said output value is in a linear relationship with said amplitude or said squared amplitude; and if said amplitude or said squared amplitude is equal to or greater than said predetermined value, said level conversion reference unit outputs a constant value as said output value.

8. The OFDM signal receiver device according to claim 5, wherein said weighting factor-calculating unit further comprises:

an adjusting unit for adjusting said noise power signal based on a modulation format or a coding rate corresponding to said OFDM signal and outputting to said level conversion unit said noise power signal that has been adjusted.

9. The OFDM signal receiver device according to claim 6, wherein said weighting factor-calculating unit further comprises:

an adjusting unit for adjusting said noise power signal based on a modulation format or a coding rate corresponding to said OFDM signal and outputting said noise power signal that has been adjusted to said level conversion unit.

10. The OFDM signal receiver device according to claim 7, wherein said weighting factor-calculating unit further comprises:

an adjusting unit for adjusting said noise power signal based on a modulation format or a coding rate corresponding to said OFDM signal and outputting to said level conversion unit said noise power signal that has been adjusted.

11. An OFDM signal receiving method, comprising:

performing a Fourier transform on a received OFDM signal to output a subcarrier component as a result of said Fourier transform;

extracting a pilot signal contained in said subcarrier component;

generating and outputting a known signal corresponding to said pilot signal;

dividing said pilot signal by said known signal to calculate a transmission channel characteristic corresponding to said pilot signal;

calculating a transmission channel characteristic corresponding to said subcarrier component based on said transmission channel characteristic of said pilot signal;

dividing said subcarrier component by said transmission channel characteristic corresponding to said subcarrier component to output a demodulated signal;

calculating power corresponding to a noise component contained in said demodulated signal based on said demodulated signal and outputting a noise power signal corresponding to a result of said calculation;

calculating a weighting factor for a branch metric based on said transmission channel characteristic corresponding to said subcarrier component and said noise power signal; and decoding said demodulated signal based on said weighting factor.

12. An OFDM signal receiving method, comprising:

calculating a transmission channel characteristic corresponding to a subcarrier component which is contained in a received OFDM signal based on said transmission channel characteristic calculated based on a pilot signal in said subcarrier component and a known signal;

calculating an electric power corresponding to a noise component which is contained said received OFDM; and calculating a weighting factor for a branch metric based on said transmission channel characteristic and said electric power.

* * * * *